United States Patent [19]

Takemura

[11] Patent Number: 5,397,731
[45] Date of Patent: Mar. 14, 1995

[54] METHOD OF MANUFACTURING SEMICONDUCTOR INTEGRATED CIRCUIT DEVICE

[75] Inventor: Hisashi Takemura, Tokyo, Japan

[73] Assignee: NEC Corporation, Tokyo, Japan

[21] Appl. No.: 264,998

[22] Filed: Jun. 24, 1994

[30] Foreign Application Priority Data

Jun. 30, 1993 [JP] Japan .................................. 5-186842

[51] Int. Cl.6 ............................................. H01L 21/76
[52] U.S. Cl. ........................................ 437/67; 437/33; 437/978; 437/63; 437/64; 148/DIG. 50
[58] Field of Search ...................... 437/67, 33, 978, 63, 437/64; 148/DIG. 50

[56] References Cited

U.S. PATENT DOCUMENTS

| 4,139,442 | 2/1979 | Bondur et al. | 437/67 |
| 4,551,911 | 11/1985 | Sasaki et al. | 437/67 |
| 4,679,306 | 7/1987 | Shimizu | 437/67 |
| 4,749,661 | 6/1988 | Bower | 437/33 |
| 4,988,639 | 1/1991 | Aomura | 437/67 |
| 5,011,788 | 4/1991 | Kawaji et al. | 437/33 |
| 5,340,755 | 8/1994 | Zwicknagl et al. | 437/33 |

FOREIGN PATENT DOCUMENTS

| 0289642 | 12/1986 | Japan | 437/67 |
| 0092024 | 4/1988 | Japan | 437/67 |
| 0309373 | 12/1989 | Japan | 437/67 |
| 0028330 | 1/1990 | Japan | 437/67 |
| 0054556 | 2/1990 | Japan | 448/DIG. 50 |
| 0121537 | 5/1993 | Japan | 437/67 |

Primary Examiner—Brian E. Hearn
Assistant Examiner—Trung Dang

[57] ABSTRACT

A method of manufacturing a semiconductor integrated circuit device includes the steps of: sequentially forming a silicon oxide film, a silicon nitride film, a polysilicon film; and a protective film on a silicon substrate, etching and removing the protective film from a shallow groove formation region to expose a surface of the polysilicon film; etching and removing the protective film, the polysilicon film, the silicon nitride film, and the silicon oxide film from a deep groove formation region to expose asurface of the silicon substrate; etching the silicon substrate and the polysilicon film, both of which are exposed, using the protective film as a mask to form agroove having a predetermined depth in the deep groove formation region; etching and removing at least the silicon oxide film left in the shallow groove formation region to expose a surface of the silicon substrate; and simultaneously etching the silicon substrate in the deep and shallow groove formation regions using the protective film as a mask to form deep and shallow grooves.

6 Claims, 6 Drawing Sheets

METHOD OF MANUFACTURING SEMICONDUCTOR INTEGRATED CIRCUIT DEVICE

BACKGROUND OF THE INVENTION

1. Field of the Invention

The present invention relates to a method of manufacturing a semiconductor integrated circuit device and, more particularly, to a method of manufacturing a semiconductor integrated circuit device having deep and shallow isolation grooves.

2. Description of the Prior Art

In the manufacture of a semiconductor integrated circuit device, it is sometimes necessary to form grooves having different depths, e.g., a deep isolation groove for isolating elements from each other and a shallow isolation groove for isolating regions in each element. For example, in a bipolar semiconductor integrated circuit device, it is required to form a shallow groove for isolating a collector and a base from each other at the upper portion of a buried collector layer and a deep isolation groove which extends through the buried collector layer to isolate elements from each other.

Figure 1A:
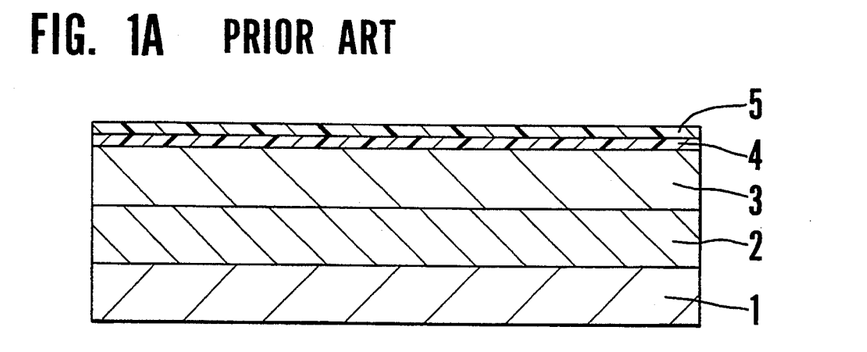
FIGS. 1A to 1C are sectional views showing manufacturing steps according to the first conventional method.
Figure 1B:
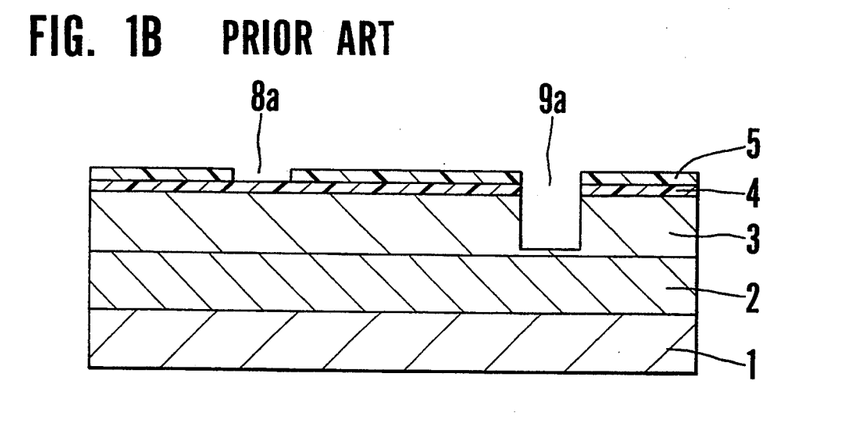
Figure 1C:
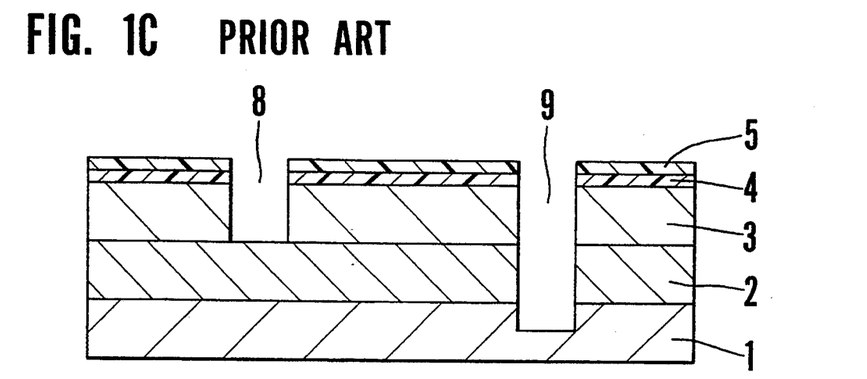

FIGS. 1A to 1C are sectional views showing steps in the manufacture of isolation grooves of this type, which is disclosed in Japanese Patent Laid-Open No. 57-204144.

As shown in FIG. 1A, a buried collector layer 2 is formed on a p-type silicon substrate 1, and an n-type epitaxial layer 3 is epitaxially grown on the buried collector layer 2. The surface is then thermally oxidized to form a silicon oxide film 4, and a silicon nitride film 5 is formed on the silicon oxide film 4 using the CVD method.

As shown in FIG. 1B, the silicon nitride film 5 in a collector isolation region 8a and an element isolation region 9a is removed by the photoetching method. The silicon oxide film 4 exposed to the element isolation region 9a is removed by photoetching. Subsequently, the silicon is etched by reactive sputter etching to form a groove having a predetermined depth in the element isolation region 9a.

As shown in FIG. 1C, the silicon oxide film 4 on the collector isolation region 8a is etched and removed using an HF solution. The silicon is etched again using the reactives putter etching method, thereby completing a shallow collector isolation groove 8 reaching the buried collector layer 2, and a deep element isolation groove 9 extending through the buried collector layer 2.

This method is characterized in that, first of all, a groove is formed to a depth corresponding to the difference in depth between the shallow and deep grooves, and the two grooves are then simultaneously formed. According to this method, the two grooves each having an accurate depth can be formed.

Figure 2A:
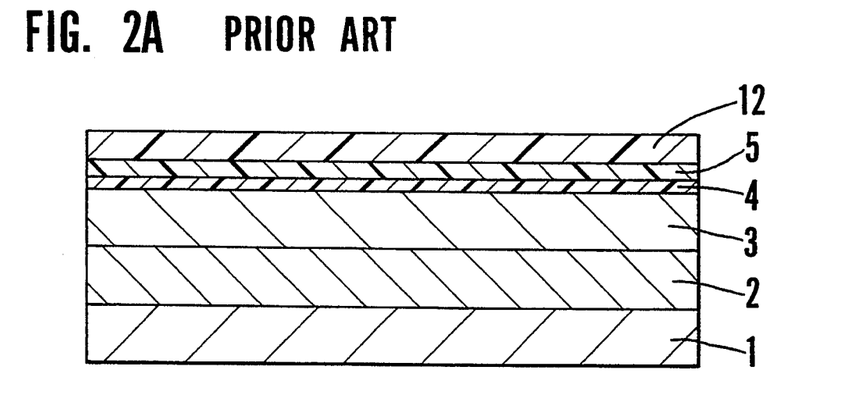
FIGS. 2A to 2C are sectional views showing manufacturing steps according to the second conventional method.
Figure 2B:
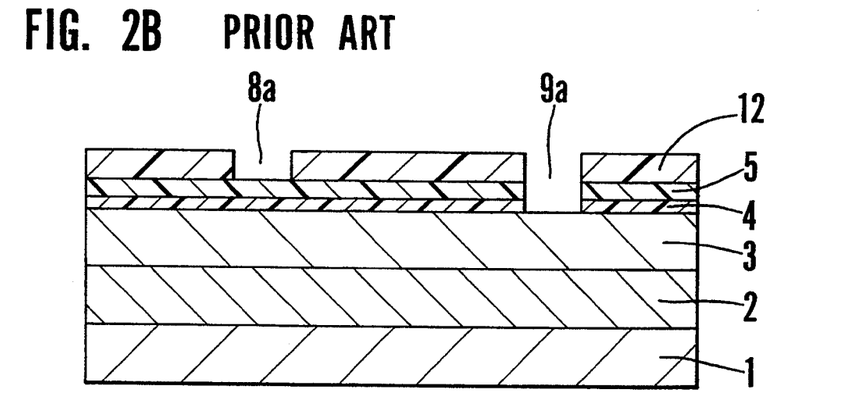
Figure 2C:
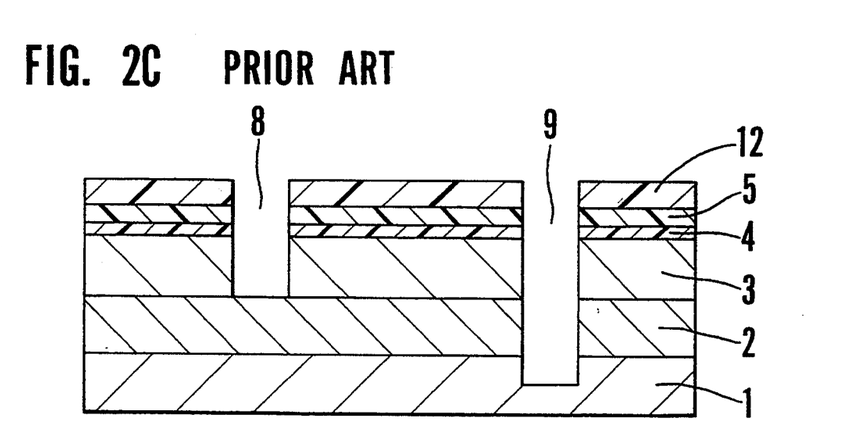

FIGS. 2A to 2C are sectional views showing steps in the manufacture of grooves of this type, according to another method proposed in Japanese Patent Laid-Open No. 4-20261.

As shown in FIG. 2A, as in the first conventional method, a buried collector layer 2 is formed on a p-type silicon substrate 1, and an n-type epitaxial layer 3 is formed on the buried collector layer 2. Thereafter, the surface is thermally oxidized to form a silicon oxide film 4, and a silicon nitride film 5 is formed thereon. In this method, a PSG film 12 is formed on the resultant structure using the CVD method.

As shown in FIG. 2B, the PSG film 12, the silicon nitride film 5, and the silicon oxide film 4 in an element isolation region 9a are etched and removed by photoetching to expose the surface of the silicon substrate. Subsequently, the PSG film 12 in a collector isolation region 8a is etched and removed to expose the surface of the silicon nitride film 5.

The entire surface is simultaneously etched using the reactive ion etching method. At this time, the silicon nitride film 5 and the silicon oxide film 4 are etched in the collector isolation region 8a, and the silicon is etched in the element isolation region 9a. The surface of the silicon substrate is exposed in the collector isolation region 8a while a groove having a predetermined depth is formed in the element isolation region. The silicon substrate is further etched from this state, thereby completing a collector isolation groove 8 and an element isolation groove 9 (FIG. 2C).

Figure 3:
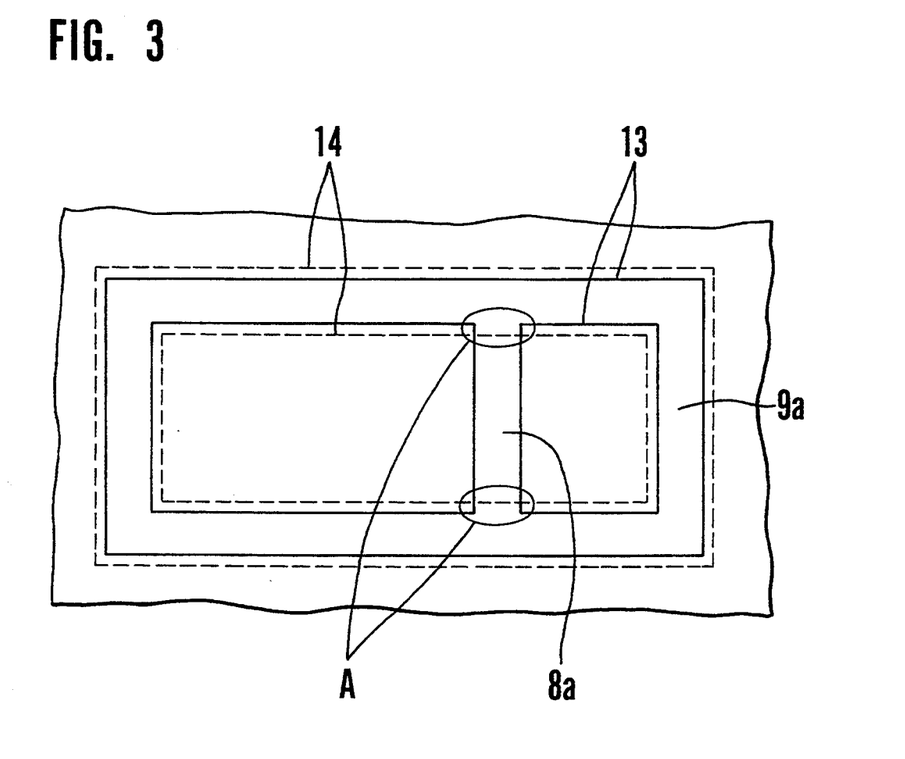
FIG. 3 is a plan view for explaining a problem of the first conventional method.

According to the above-described first conventional manufacturing method, after the silicon nitride film in the collector isolation region 8a and the element isolation region 9a is removed, the oxide film in the element isolation region 9a is removed. In this case, in consideration of the patterning accuracy or misalignment of the two patterns, a first-time silicon oxide film etching pattern 14 (indicated by broken lines) for forming the deep groove is formed wider than a silicon nitride film etching pattern 13 indicated by solid lines, as shown in FIG. 3. For this reason, at the connecting portions between the collector isolation region 8a and the element isolation region 9a, which are indicated by symbol A, the silicon oxide film 4 in the collector isolation region 8a is removed together with the oxide film in the element isolation region 9a. As a result, a deep groove is formed in the collector isolation region, and the collector region is decreased to cause an increase in collector resistance or degradation in element characteristics. As the semiconductor integrated circuit becomes finer, this problem becomes more serious.

In addition, according to this conventional method, the silicon nitride film is used as an etching mask when the silicon is etched. However, the etching rate of the silicon is not so different from that of the silicon nitride film. Therefore, the thickness of the silicon nitride film must be increased, and a stress is applied in the semiconductor substrate.

According to the above-described second conventional manufacturing method, the difference in depth between the collector isolation groove 8 and the element isolation groove 9 depends on the thickness of the silicon nitride film. Therefore, it is difficult to form a groove having an accurate depth. The thickness of the silicon nitride film tends to vary due to a difference in thickness at the time of film formation, or a difference in etching depth in the etching and removing process of the PSG film on the collector isolation region 8a. Accordingly, the difference in depth between the collector isolation groove and the element isolation groove largely varies.

With the recent advance in micropatterning of semiconductor integrated circuit devices, a collector buried layer or n-type epitaxial layer gradually becomes thinner. This tendency is remarkably observed in SOI (Silicon on Insulator) integrated circuits. Accordingly, it is required to exactly control the depth of an isolation groove. However, the above-described second conventional method can hardly cope with this tendency.

SUMMARY OF THE INVENTION

The present invention has been made in consideration of the above situation, and has as its first object to prevent a collector region from being decreased, thereby particularly avoiding degradation in characteristics of a micropatterned transistor. It is the second object of the present invention to prevent a stress in a semiconductor substrate, thereby manufacturing a semiconductor integrated circuit device with high reliability. It is the third object of the present invention to form an isolation groove having an accurate depth, thereby preventing a decrease in yield.

In order to achieve the above objects, according to the first aspect of the present invention, there is provided a method of manufacturing a semiconductor integrated circuit device, comprising the steps of: sequentially forming a silicon oxide film, a silicon nitride film, a polysilicon film, and a protective film on a silicon substrate; etching and removing the protective film from a shallow groove formation region to expose a surface of the polysilicon film; etching and removing the protective film, the polysilicon film, the silicon nitride film, and the silicon oxide film from a deep groove formation region to expose a surface of the silicon substrate; etching the silicon substrate and the polysilicon film, both of which are exposed, using the protective film as a mask to form a groove having a predetermined depth in the deep groove formation region; etching and removing the silicon nitride and oxide films left in the shallow groove formation region to expose a surface of the silicon substrate; and simultaneously etching the silicon substrate in the deep and shallow groove formation regions using the protective film as a mask to form deep and shallow grooves.

According to the second aspect of the present invention, there is provided a method of manufacturing a semiconductor integrated circuit device, further comprising the step of forming a thin silicon oxide film before the step of etching and removing the protective film, the polysilicon film, the silicon nitride film, and the silicon oxide film from the deep groove formation region to expose the surface of the silicon substrate but after the step of etching and removing the protective film from the shallow groove formation region to expose the surface of the polysilicon film in the first aspect.

According to the third aspect of the present invention, there is provided a method of manufacturing a semiconductor integrated circuit device, further comprising the step of burying the shallow and deep grooves with an insulator after the shallow and deep grooves are formed in one of the first and second aspects.

According to the fourth aspect of the present invention, there is provided a method of manufacturing a semiconductor integrated circuit device, wherein the step of etching and removing the protective film, the polysilicon film, the silicon nitride film, and the silicon oxide film from the deep groove formation region to expose the surface of the silicon substrate is performed before the step of etching and removing the protective film from the shallow groove formation region to expose the surface of the polysilicon film.

According to a method of manufacturing a semiconductor integrated circuit device of the present invention, after the polysilicon film and the protective film are formed on the silicon nitride film, and the shallow groove formation region and the deep groove formation region are independently patterned, the deep groove is etched midway, and the shallow groove is then formed to a predetermined depth. This method provides the following effects.

① No deep groove is formed in the shallow groove formation region. For this reason, when the shallow groove is used for collector isolation of the transistor, the collector region is not decreased, thereby preventing degradation in characteristics of the transistor.

② No thick silicon nitride film need to be deposited. Therefore, a stress will not act in the semiconductor substrate.

③ The shallow and deep grooves can be formed to their desired depths with high accuracy.

④ When a thick polysilicon film is formed, or an additional silicon oxide film is formed after the silicon oxide film on the shallow groove formation region is removed as in the second embodiment, a groove having a depth of 4 μm or more can also be easily formed.

⑤ The polysilicon film serves as a protective film in the etch-back process of the buried insulating film on the isolation groove. Therefore, a thick buried insulating filmcan be easily removed.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF PREFERRED EMBODIMENTS

DETAILED DESCRIPTION OF THE PREFERRED EMBODIMENTS

Preferred embodiments of the present invention shown in the accompanying drawings (FIGS. 4A to 6C) will be described below.

FIGS. 4A to 4E are sectional views showing steps in manufacturing a semiconductor integrated circuit device according to the first embodiment of the present invention.

Figure 4A:
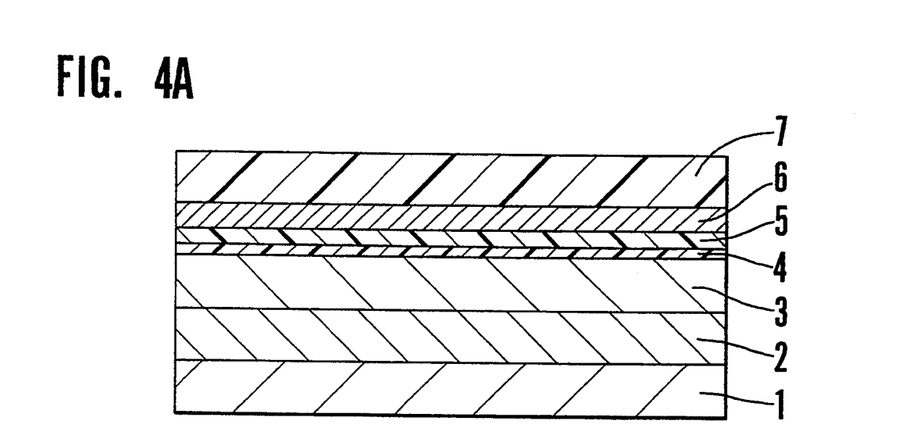
FIGS. 4A to 4E are sectional views showing manufacturing steps according to the first embodiment of the present invention.

Arsenic (As) is doped by thermal diffusion to form a buried collector layer 2 having a thickness of about 2 μm on the surface of a p-type silicon substrate 1. An n-type epitaxial layer 3 having a thickness of about 1 μm is epitaxially grown on the buried collector layer 2. A silicon oxide film 4 having a thickness of about 0.05 μm is formed on the surface of the epitaxial layer 3 by thermal oxidation. A silicon nitride film 5 having a thickness of about 0.15 μm and a polysilicon film 6 having a thickness of about 0.25 μm are then formed on the silicon oxide film 4 using the CVD method. Thereafter, a silicon oxide film 7 having a thickness of about 0.5 μm, which serves as a protective film at the time of silicon etching, is formed on the polysilicon film 6 (FIG. 4A).

Figure 4B:
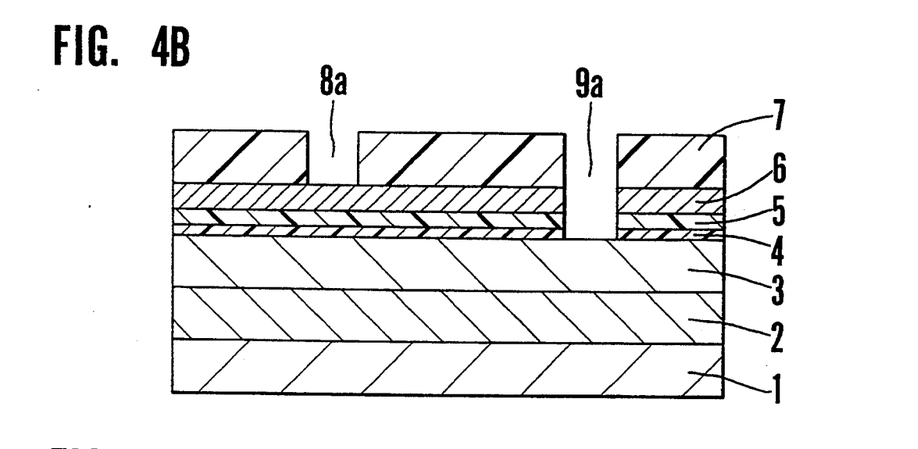

As shown in FIG. 4B, the silicon oxide film 7 on a collector isolation region 8a is removed by photoetching to expose the polysilicon film 6. Subsequently, the silicon oxide film 7, the polysilicon film 6, the silicon nitride film 5, and the silicon oxide film 4 in an element isolation region 9a are removed by anisotropic etching.

Figure 4C:
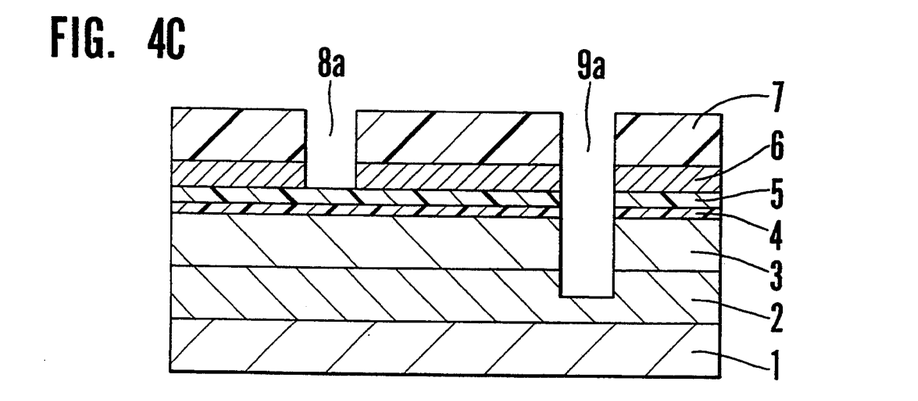
Figure 4D:
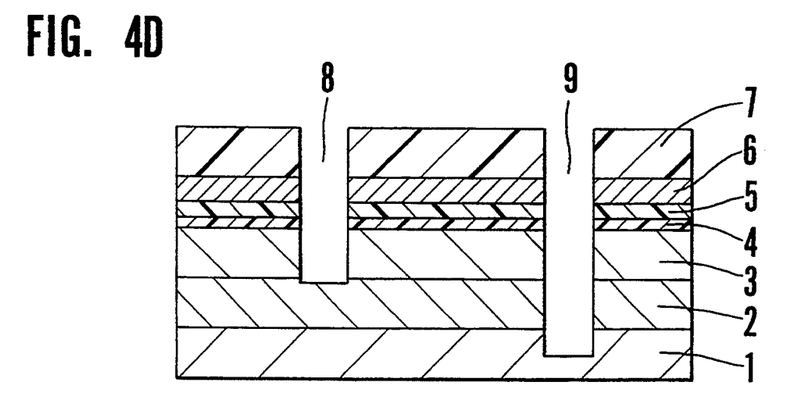
Figure 4E:
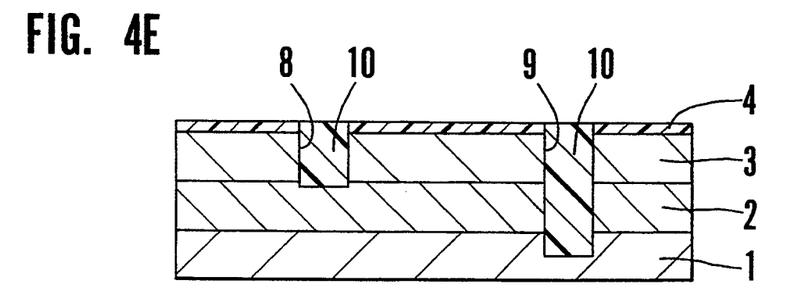
Figure 5:
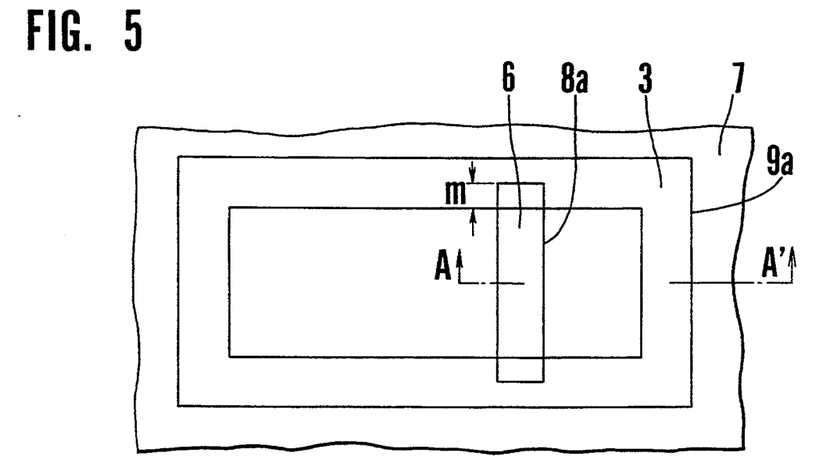
FIG. 5 is a plan view for explaining the first embodiment corresponding to FIG. 4B.

A planer shape at this time is shown in FIG. 5. FIGS. 4A to 4E are sectional views taken along line A–A' in FIG. 5. As shown in FIG. 5, a margin m is left between a mask pattern for forming a collector isolation groove and a mask pattern for forming an element isolation groove to avoid a discontinuous state of the two grooves.

As shown in FIG. 4C, the silicon substrate in the element isolation region 9a is removed by anisotropic etching to form a Groove having a depth larger than 2 μm, Which extends through the n-type epitaxial layer 3 to reach the inside of the buried collector layer 2. In this process, the polysilicon film 6 in the collector isolation region 8a is simultaneously removed, and all or part of the exposed silicon nitride film 5 is also removed.

The silicon nitride film 5 (if an etching residue is present) and the silicon oxide film 4 in the collector isolation region 8a are removed by plasma etching to expose the silicon in the collector isolation region 8a. With this process, the Groove in the element isolation region 9a also slightly becomes deeper. The exposed silicon substrate is etched by anisotropic etching to form a collector isolation groove 8 having a depth of about 1 μm. In this process, the silicon in the element isolation region 9a is also simultaneously etched to form an element isolation groove 9 having a depth slightly larger than 3 μm, which extends through the buried collector layer 2 to reach the inside of the silicon substrate 1 (FIG. 4D).

A silicon oxide film 10 is then deposited by the CVD method and etched back to remove the silicon oxide film from the substrate. In this etch-back process, the polysilicon film 6 serves as an etching protective film. Subsequently, the polysilicon film 6 and the silicon nitride film 5 on the substrate are etched and removed, thereby completing the collector isolation groove 8 and the element isolation groove 9, both of which are buried with the silicon oxide film 10, as shown in FIG. 4E.

As has been described above, according to the present invention, patterning of the collector isolation region 8a and patterning of the element isolation region 9a are independently performed. For this reason, even when the margin m is left between the two patterns (FIG. 5), no deep groove is formed in the collector isolation region 8a, thereby preventing degradation in characteristics of the transistor. In addition, since the polysilicon film is deposited on the silicon nitride film, a thinner silicon nitride film can be formed, thereby preventing a stress in the substrate.

In this embodiment, the order of the patterning process for removing the silicon oxide film 7 from the collector isolation region 8a and the patterning process for removing the silicon oxide film 7, the polysilicon film 6, the silicon nitride film 5, and the silicon oxide film 4 from the element isolation region 9a can be reversed.

Figure 6A:
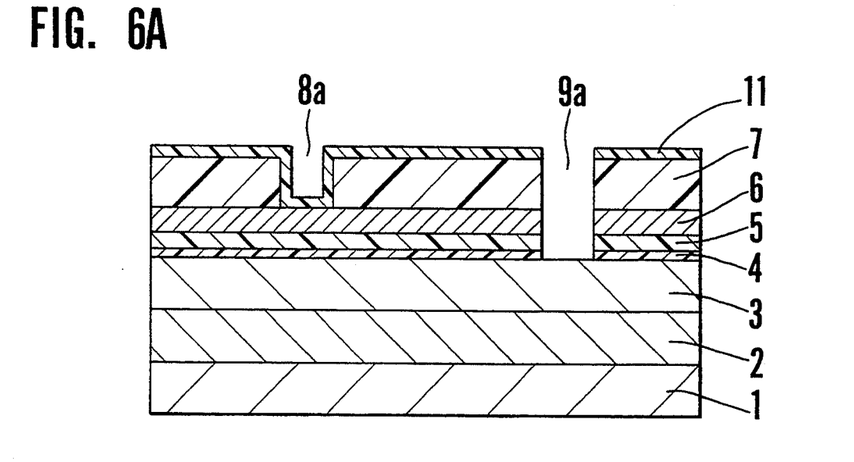
FIGS. 6A to 6C are sectional views showing manufacturing steps according to the second embodiment of the present invention.
Figure 6B:
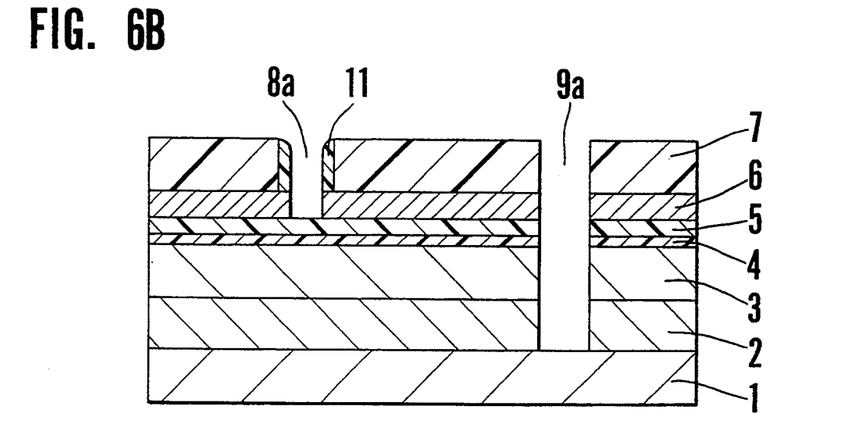
Figure 6C:
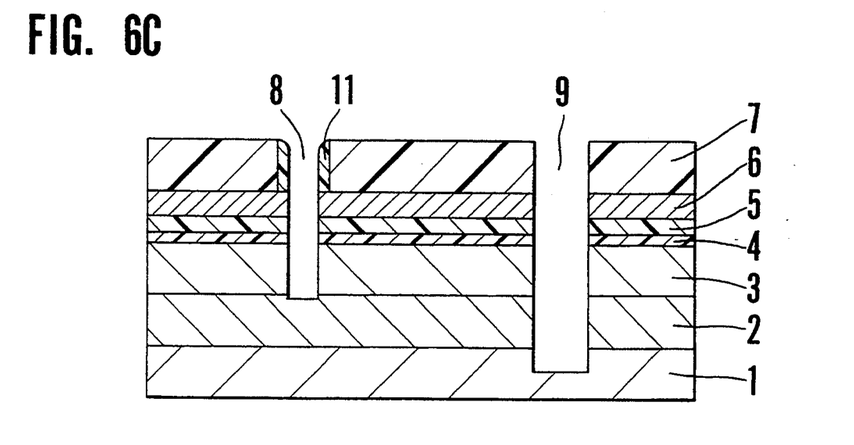

FIGS. 6A to 6C are sectional view showing manufacturing steps according to the second embodiment of the present invention. In this embodiment, processes until a silicon oxide film 7 is deposited on a substrate are the same as in the first embodiment shown in FIG. 4A.

Thereafter, the silicon oxide film 7 in a collector isolation region 8a is removed by photoetching to expose the surface of a polysilicon film 6. A silicon oxide film 11 having a thickness of 1,000 Å is then deposited using the CVD method. The silicon oxide films 11 and 7, the polysilicon film 6, a silicon nitride film 5, and a silicon oxide film 4 in an element isolation region 9a are removed by anisotropic etching (FIG. 6A).

The silicon in the element isolation region 9a is removed by anisotropic etching to form a groove having a depth larger than 3 μm, which extends through an n-type epitaxial layer 3 and a buried collector layer 2. At this time, the silicon oxide film 11 in the collector isolation region 8a is also simultaneously etched because the selectivity ratio of silicon in the anisotropic etching is silicon:oxide film=10:1. The polysilicon film 6 is also etched (FIG. 6B).

Subsequently, the silicon nitride film (if an etching residue is present) and the silicon oxide film 4 on the collector isolation region 8a are removed by plasma etching. The silicon is etched by anisotropic etching to form a collector isolation groove 8 having a depth of 1 μm. At this time, the silicon in the element isolation region is simultaneously removed to form an element isolation groove 9 having a depth slightly larger than 4 μm (FIG. 6C). Thereafter, with the same processes as in the first embodiment, the isolation grooves 8 and 9 having different depths are buried with a silicon oxide film.

In this embodiment, the silicon oxide film 11 serving as an etching protective film is deposited on the polysilicon film 6 on the collector isolation region 8a before patterning of the element isolation region 9a. Therefore, the same effect as in the first embodiment can be obtained. In addition, an element isolation groove deeper than that in the first embodiment can be formed.

Although the preferred embodiments have been described above, the present invention is not limited to these embodiments, and various changes and modifications canbe made within the spirit and scope of the invention as defined in the appended claims. For example, the silicon oxide film 10 for burying the isolation grooves 8 and 9 or the silicon oxide film 7 formed on the polysilicon film can be replaced with an insulating film such as a PSG film.

What is claimed is:

1. A method of manufacturing a semiconductor integrated circuit device, comprising the steps of: sequentially forming a silicon oxide film, a silicon nitride film, a polysilicon film, and a protective film on a silicon substrate; etching and removing said protective film from a shallow groove formation region to expose a surface of said polysilicon film; etching and removing said protective film, said polysilicon film, said silicon nitride film, and said silicon oxide film from a deep groove formation region to expose a surface of said silicon substrate; etching said silicon substrate and said polysilicon film, both of which are exposed, using said protective film as a mask to form a groove having a predetermined depth in said deep groove formation region; etching and removing at least said silicon oxide film left in said shallow groove formation region to expose a surface of said silicon substrate; and simultaneously etching said silicon substrate in said deep and shallow groove formation regions using said protective film as a mask to form deep and shallow grooves.

2. A method according to claim 1, further comprising the step of forming a thin silicon oxide film before the step of etching and removing said protective film, said polysilicon film, said silicon nitride film, and said silicon oxide film from said deep groove formation region to expose said surface of said silicon substrate but after the step of etching and removing said protective film from said shallow groove formation region to expose said surface of said polysilicon film.

3. A method according to claim 1, further comprising the step of burying said shallow and deep grooves with an insulator after said shallow and deep grooves are formed.

4. A method according to claim 1, wherein the step of etching and removing said protective film, said polysilicon film, said silicon nitride film, and said silicon oxide film from said deep groove formation region to expose said surface of said silicon substrate is performed before the step of etching and removing said protective film from said shallow groove formation region to expose said surface of said polysilicon film.

5. A method according to claim 2, further comprising the step of burying said shallow and deep grooves with an insulator after said shallow and deep grooves are formed.

6. A method according to claim 2, wherein the step of etching and removing said protective film, said polysilicon film, said silicon nitride film, and said silicon oxide film from said deep groove formation region to expose said surface of said silicon substrate is performed before the step of etching and removing said protective film from said shallow groove formation region to expose said surface of said polysilicon film.

* * * * *